(12) United States Patent
Aleksov et al.

(10) Patent No.: US 10,251,272 B2
(45) Date of Patent: Apr. 2, 2019

(54) MICROELECTRONIC DEVICES DESIGNED WITH ULTRA-HIGH-K DIELECTRIC CAPACITORS INTEGRATED WITH PACKAGE SUBSTRATES

(71) Applicant: Intel Corporation, Santa Clara, CA (US)

(72) Inventors: Aleksandar Aleksov, Chandler, AZ (US); Feras Eid, Chandler, AZ (US); Thomas L. Sounart, Chandler, AZ (US); Georgios C. Dogiamis, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 15/639,873

(22) Filed: Jun. 30, 2017

(65) Prior Publication Data

US 2019/0008046 A1 Jan. 3, 2019

(51) Int. Cl.
| | |
|---|---|
| *H05K 1/16* | (2006.01) |
| *H05K 3/46* | (2006.01) |
| *H01L 23/498* | (2006.01) |
| *H01L 21/48* | (2006.01) |
| *H05K 3/12* | (2006.01) |
| *H05K 3/00* | (2006.01) |
| *H05K 3/22* | (2006.01) |

(52) U.S. Cl.
CPC ........ *H05K 1/162* (2013.01); *H01L 21/4853* (2013.01); *H01L 21/4857* (2013.01); *H01L 23/49816* (2013.01); *H01L 23/49822* (2013.01); *H01L 23/49838* (2013.01); *H01L 23/49894* (2013.01); *H05K 3/007* (2013.01); *H05K 3/12* (2013.01); *H05K 3/22* (2013.01); *H05K 3/4644* (2013.01); *H05K 3/4664* (2013.01); *H05K 2203/107* (2013.01)

(58) Field of Classification Search
CPC .... H05K 1/162; H05K 3/4664; H05K 3/4667; H05K 3/467
See application file for complete search history.

(56) References Cited

U.S. PATENT DOCUMENTS

2012/0326272 A1* 12/2012 Rokuhara ................ H01G 4/33
257/532
2016/0330840 A1* 11/2016 Leitgeb .................... H01L 41/09

* cited by examiner

*Primary Examiner* — Jeremy C Norris
(74) *Attorney, Agent, or Firm* — Schwabe, Williamson & Wyatt, P.C.

(57) ABSTRACT

Embodiments of the invention include a microelectronic device that includes a plurality of organic dielectric layers and a capacitor that is integrated with a first organic dielectric layer of the plurality of organic dielectric layers. The capacitor includes first and second conductive electrodes and an ultra-high-k dielectric layer that is positioned between the first and second conductive electrodes.

21 Claims, 13 Drawing Sheets

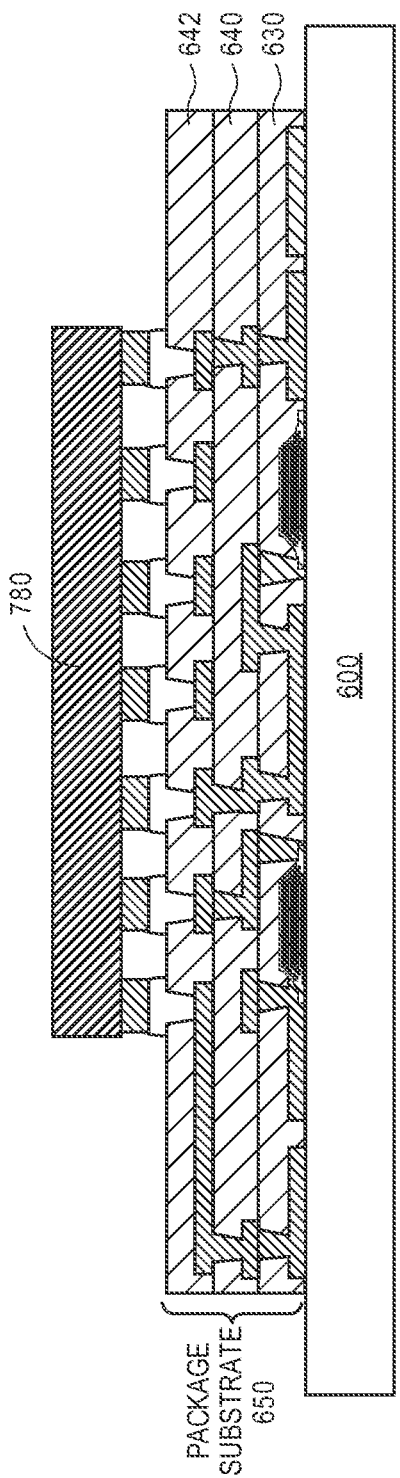
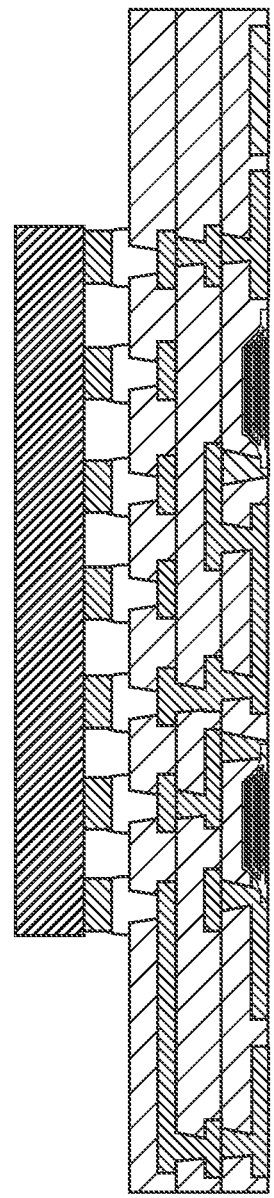
FIG. 7A
FIG. 7B

MICROELECTRONIC DEVICES DESIGNED WITH ULTRA-HIGH-K DIELECTRIC CAPACITORS INTEGRATED WITH PACKAGE SUBSTRATES

FIELD OF THE INVENTION

Embodiments of the present invention relate generally to the manufacture of semiconductor devices. In particular, embodiments of the present invention relate to microelectronic devices that are designed with ultra-high-k dielectric capacitors integrated with package substrates.

BACKGROUND OF THE INVENTION

Small form factor electronic systems are needed for internet of things devices (TOT), mobile devices, wearables, and autonomous vehicles. Since package area is limited in these systems, capacitors for power delivery require high capacitance densities (e.g., 10-10,000 nF/mm2), which requires ultra-high-k dielectric materials with relative permittivity of approximately 1,000-10,000. The dielectric materials used typically require annealing, sintering, or deposition at greater than 500 degrees C. These ultra-high-k dielectric materials are therefore deposited on rigid, high temperature substrates, and separately packaged and assembled on organic electronic packages.

Currently passive components such as capacitors, resistors, and inductors are discrete components that are attached to the substrate by component attach processes that include fluxing i.e., flux deposition, individual component pick and place, mass reflow and optionally deflux to remove any flux residue. Capacitors, are the majority of discrete components occupying a large area on the land side of the package (the side opposing the silicon die) and thus limiting the land-side area available for bumps or lands. This increases Z-height and adds assembly operations, which adds process time and cost, and becomes particularly challenging as these discrete components are miniaturized to sub-millimeter length scales and when many capacitors are required.

BRIEF DESCRIPTION OF THE DRAWINGS

FIGS. 7A-7B illustrate package-integrated ultra-high-k capacitors that are embedded within an organic substrate in accordance with one embodiment.

DETAILED DESCRIPTION OF THE INVENTION

Figure 1:
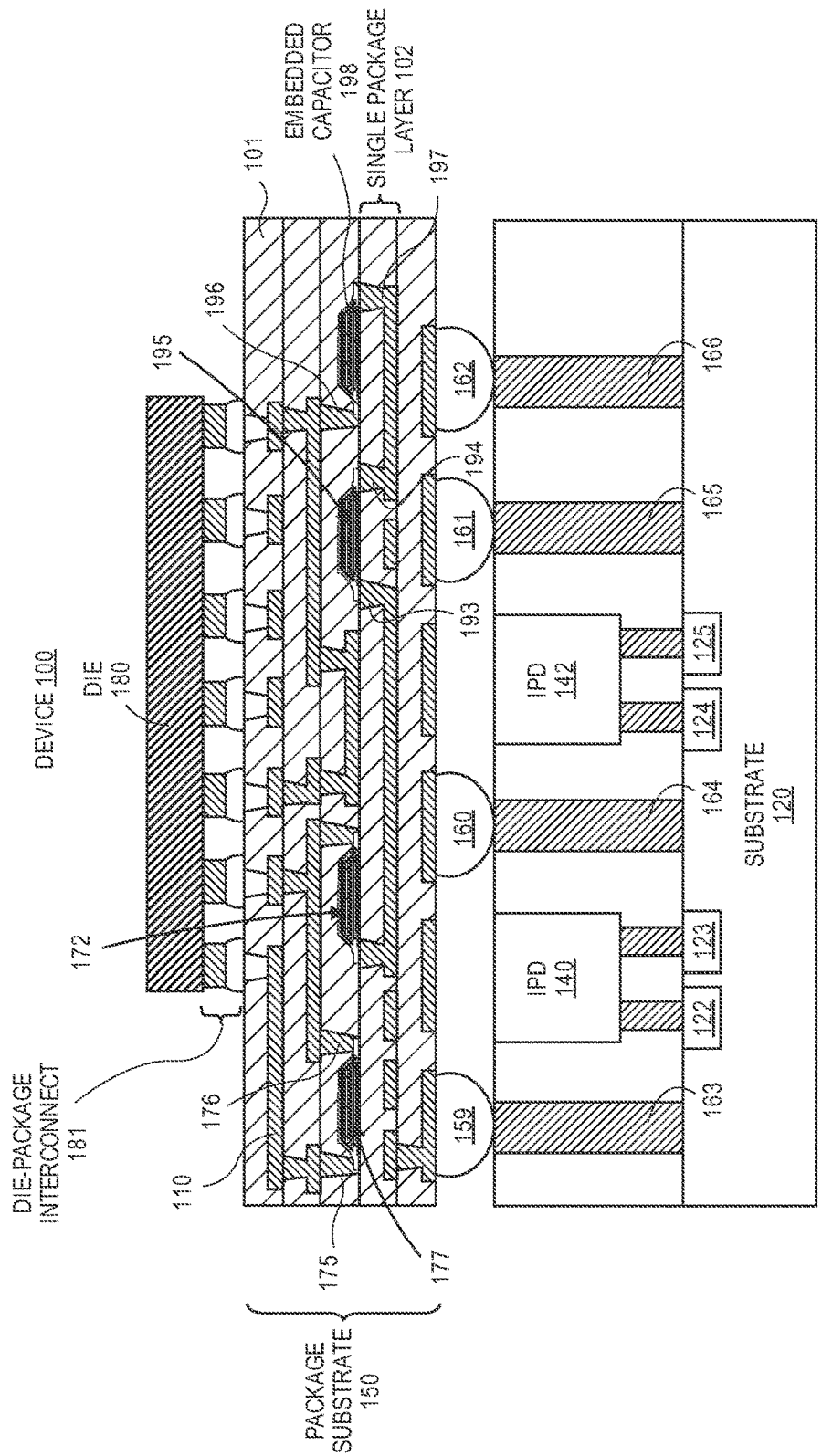
FIG. 1 illustrates a microelectronic device having package integrated ultra-high-k capacitors and substrate in accordance with one embodiment.

Described herein are ultra-high-k dielectric capacitors embedded with package substrates.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The present design includes an ultra-high-k dielectric capacitor that is embedded on a low-temperature organic substrate or in a low-temperature organic substrate to form a package-integrated capacitor with low Z-height and no assembly required. The capacitor fabrication can also be integrated into the existing package substrate layers, thus freeing up land-side area for input output (IO) lanes and power bumps, and reducing or eliminating Z-height entirely for the integrated capacitor. The present design utilizes thin films of crystalline ultra-high-k dielectric material (e.g., ferroelectric material, ferroelectric perovskite, lead zirconate titanate (PZT), barium strontium titanate (BST), barium titanate (BTO), sodium potassium niobate (KNN), etc.), that is deposited on one or more of the layers in an organic package substrate to act as the dielectric layer of a substrate-integrated capacitor.

Integration of capacitors into the package substrate can save cost and reduce package Z-height. The Z-height reduction would hold even if the capacitors would require a separate package layer having a thickness less than 50 microns (e.g., less than 40 microns, approximately 30 microns, etc.) as opposed to a discrete capacitor. Currently, the thinnest discrete capacitors for power delivery add at least 200 um of Z-height to a package substrate.

One option includes creating capacitors in package by embedding discrete components into the package instead of placing them on either side of the package. The present design addresses a possible way to integrate multi-layer capacitors with very high capacitance densities (e.g., 10 nF/mm$^2$-10000 nF/mm$^2$) for power-delivery applications into the substrate using ferroelectric materials or other ultra-high k materials as capacitor dielectrics. The capacitors themselves can be manufactured by additive processes.

In the present design, the capacitors are embedded in the layers of the package substrate, thus adding no Z-height to the package substrate. Even if deposited on a substrate, the Z-height of the capacitors would be only 1 to 10 um. In either case, the present design enables significantly reduced package thickness.

Conventional discrete capacitors occupy large areas of the land-side of the package. In the present design, the capacitors can be fabricated within the layers of the substrate, therefore reducing or eliminating the discrete power-delivery capacitors on the land-side, providing more area for lands/bumps, and ultimately reducing the package x-y form-factor.

The present design utilizes ultra-high-k dielectric materials and additive manufacturing or printing in conjunction with a substrate carrier. The design provides a low cost method for creating multi-layer capacitors that can be integrated into the substrate with high capacitance densities suitable to replace the discrete capacitors used for power-delivery. Printing techniques are being used more and more widely in semiconductor manufacturing including substrate package and display due to saving material cost and reduce processing complexity. Printing processes discussed herein are stencil printing, gravure printing, offset printing and inkjet printing to manufacture the capacitors. The dielectric and electrodes are printed. Thermal treatment, which can be annealing in an oven or laser annealing, depending on the maximum temperature that the carrier can withstand after each printing step or after the entire stack is printed (or both) can be used to obtain the desired final material properties.

In one example, the present design allows for the seamless integration of multi-layer ceramic capacitors into a packaging substrate by creating the capacitors on a carrier and using printing to have capacitor arrays generated to fit a desired product need and geometry exactly. The benefit of package integrated capacitors is reduced package Z-height (that is Z-height of the entire assembly, e.g., die, substrate, discrete components) as well as reduced x/y form-factor of the package because now the entire backside is available for lands i.e., bumps or a significantly increased area is available for lands/bumps as not all discrete landside capacitors may be replaceable. In addition lower cost may be possible. Package integrated capacitors also have reduced parasitics from their electrodes in comparison to discrete capacitors assembled on a package. Hence, both equivalent series resistance (ESR) and parasitic inductance will be reduced for package integrated capacitors.

Currently if discrete capacitors are to be embedded into the package, ultra-thick buildup layers need to be used or the capacitors need to be integrated into the cores of substrates. The capacitors need to be placed within a cavity in a layer or core and then this cavity needs to be filled with organic material (such as epoxy build up films) without leaving any air gaps before the buildup of other layers may commence.

FIG. 1 illustrates a microelectronic device having package integrated ultra-high-k capacitors and substrate in accordance with one embodiment. The microelectronic device 100 includes an optional substrate 120 and a package substrate 150 having ultra-high-k capacitors 172, 177, 195, and 198. The package substrate 150 includes conductive layers (e.g., 110), connections (e.g., 175, 176, 193, 194, 196, 197) and dielectric material 101 (e.g., organic material, low temperature co-fired ceramic materials, liquid crystal polymers, etc.) of package layers (e.g., single package layer 102). The capacitors each include conductive electrodes and an ultra-high-k dielectric layer that is disposed between the conductive electrodes.

The components 122-125 of the substrate 120 and Integrated Passive Devices (IPDs) 140 and 142 can communicate with components of the substrate 150 or other components not shown in FIG. 1 using connections 163-166 and solder balls 159-162. The IPDs may include any type of passives including inductors, transformers, capacitors, and resistors. In one example, capacitors on the IPD die may be used for power delivery. In another example, resistors on the same or a different IPD may be used for digital signal equalization. In another example, the substrate 120 is a printed circuit board.

The capacitors can be created during substrate manufacturing as part of the build up layers of the substrate 150. The capacitors can also be coupled to the die 180.

Figure 2:
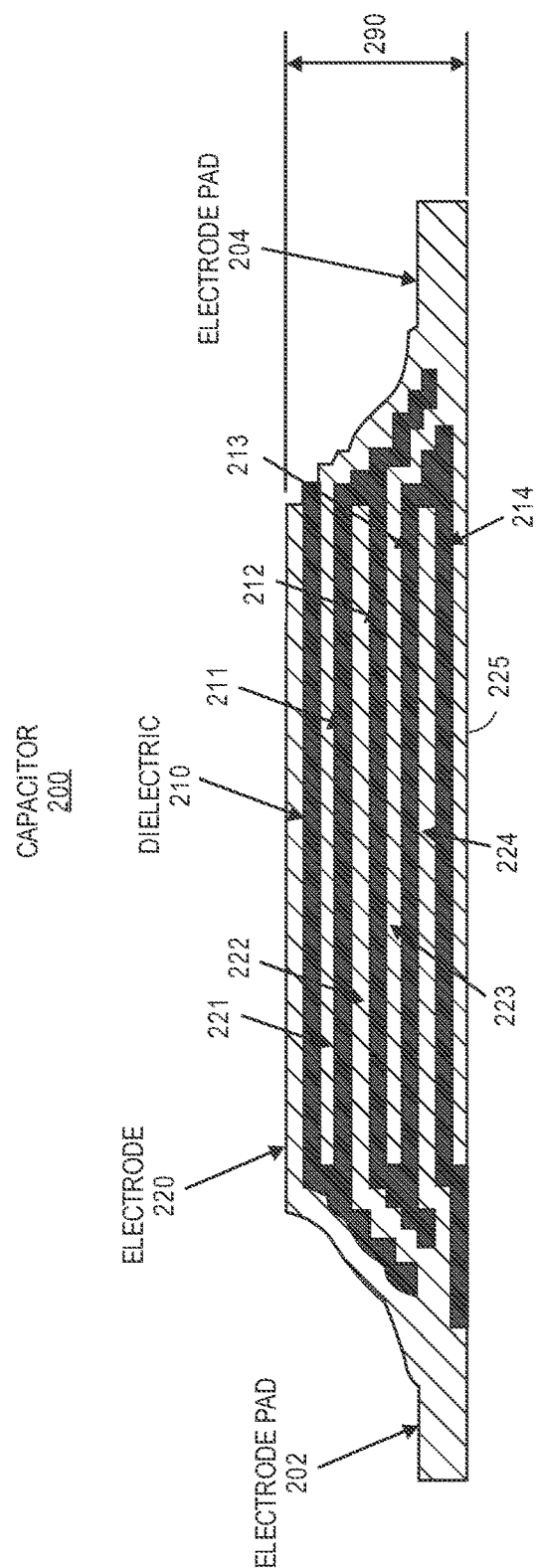
FIG. 2 illustrates an ultra-high-k capacitor structure in accordance with one embodiment.

FIG. 2 illustrates an ultra-high-k capacitor structure in accordance with one embodiment. The ultra-high-k capacitor 200 includes conductive electrodes 220-225, electrode pads 202 and 204, and ultra-high-k dielectric layers 210-214. The multilayer parallel-plate capacitor 200 includes 5 dielectric layers that represent 5 parallel-plate capacitors connected in parallel. The capacitor can be embedded in an organic package substrate and electrically routed with the standard conductive layers and connections in the package substrate. The ultra-high-k dielectric layers (e.g., ferroelectric material, ferroelectric perovskite, lead zirconate titanate (PZT), barium strontium titanate (BST), barium titanate (BTO), sodium potassium niobate (KNN), etc.) can be any material with permittivity high enough to achieve a capacitance density in the range of 10-10,000 $nF/mm^2$. The thickness of the ultra-high-k dielectric layer can range from about 30 nanometers (nm) to 1000 nm, while the relative permittivity will range from at least 200 up to as high as 10,000, but typically will be in the range of 1000 to 5000. The capacitor 200 has a Z-height 290 that varies depending on a number of conductive electrodes and dielectric layers. The Z-height is less than 50 microns. The capacitor 200 can have 2 to N parallel electrode plates with N being an integer.

Figure 3:
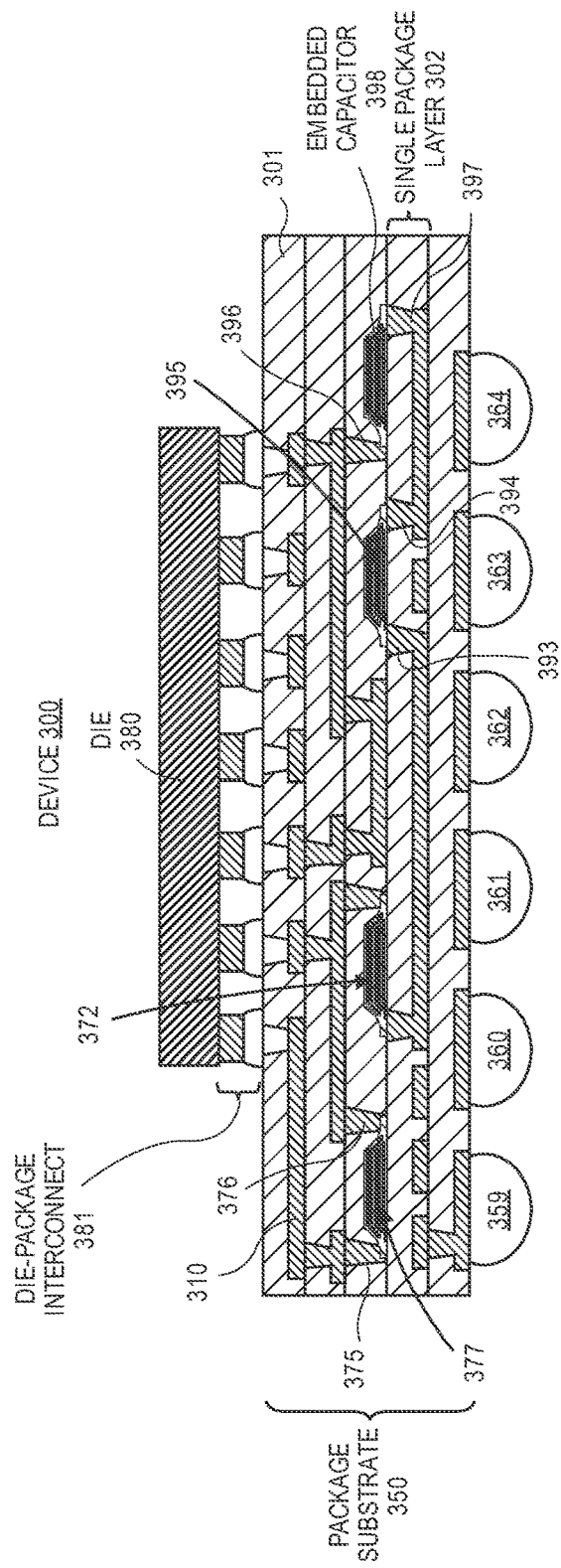
FIG. 3 illustrates a microelectronic device having a package substrate with package integrated ultra-high-k capacitors in accordance with one embodiment.

FIG. 3 illustrates a microelectronic device having a package substrate with package integrated ultra-high-k capacitors in accordance with one embodiment. The microelectronic device 300 includes a package substrate 350 having ultra-high-k capacitors 372, 377, 395, and 398, dielectric material 301 (e.g., organic material, low temperature co-fired ceramic materials, liquid crystal polymers, etc.) of package layers (e.g., single package layer 302), and different levels of conductive layers (e.g., 310) and connections (e.g., 375, 376, 393, 394, 396, 397). The capacitors each include conductive electrodes and an ultra-high-k dielectric layer that is disposed between the conductive electrodes. Different types of connections can be formed to the capacitors. For example, the capacitor 377 is contacted with connections 375 and 376 on an upper region of electrodes. The capacitor 395 is contacted with connections 393 and 394 on a lower region of the electrodes. The capacitor 398 is contacted with connection 396 on an upper region of an electrode and with connection 397 on a lower region of an electrode. The package 350 into which the capacitors are integrated in FIG. 3 is a coreless package, but integration to cored packages is also possible. The parallel-plate capacitors are embedded in the organic package substrate 350 and electrically routed with the standard conductive layers and connections in the package substrate.

Figure 4:
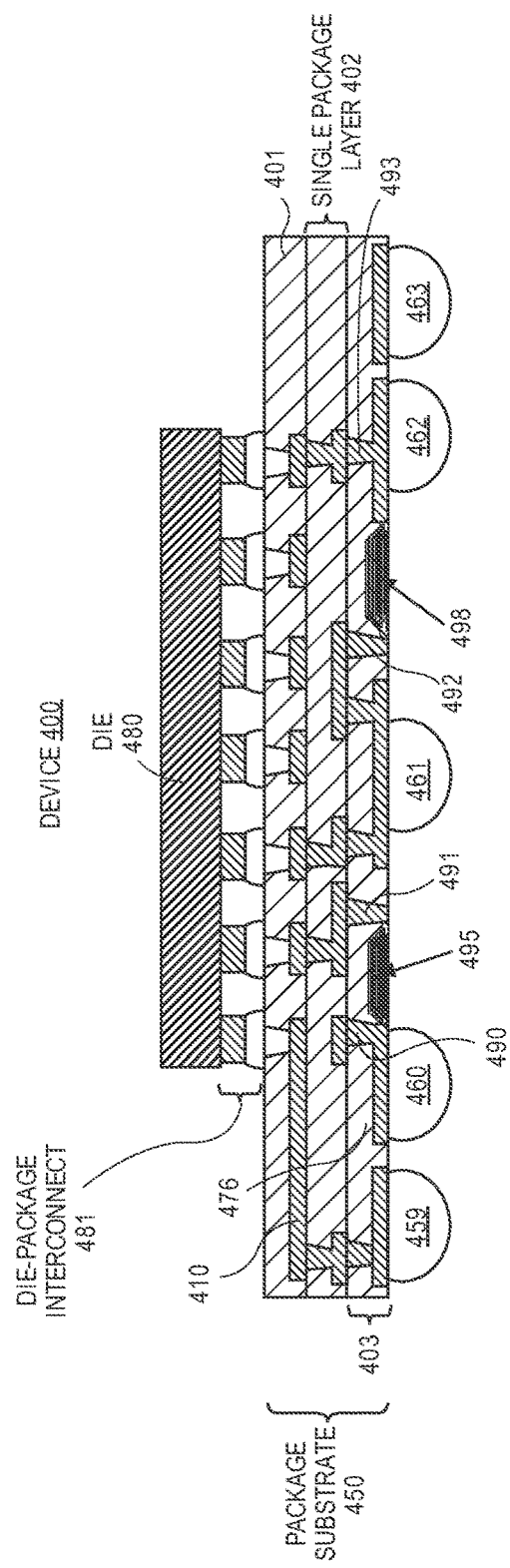
FIG. 4 illustrates a microelectronic device having a package substrate with package integrated ultra-high-k capacitors in accordance with one embodiment.

FIG. 4 illustrates a microelectronic device having a package substrate with package integrated ultra-high-k capacitors in accordance with one embodiment. The microelectronic device 400 includes a package substrate 450 having ultra-high-k capacitors 495 and 498, dielectric material 401 (e.g., organic material, low temperature co-fired ceramic materials, liquid crystal polymers, etc.) of package layers (e.g., single package layer 402), and different levels of conductive layers (e.g., 410) and connections (e.g., 490-493). The capacitors each include conductive electrodes and an ultra-high-k dielectric layer that is disposed between the conductive electrodes. Different types of connections can be formed to the capacitors. The parallel-plate capacitors are embedded in a bottom layer 403 of the organic package substrate 450 and electrically routed with the standard conductive layers and connections in the package substrate. Embedded capacitors in the bottom layer of the package substrate may result in a cost-efficient method of manufacturing the package substrate.

Using the present design, multi-layer capacitors with high-capacitance densities can be manufactured and integrated with the substrate. To give an illustration of the capacitance densities that can be achieved, the present design provides for the manufacturing of ultra-high-k dielectric materials with a dielectric constant in the range of 1000-10000, which matches that of the dielectric materials used in today's discrete ceramic capacitors.

Figure 5:
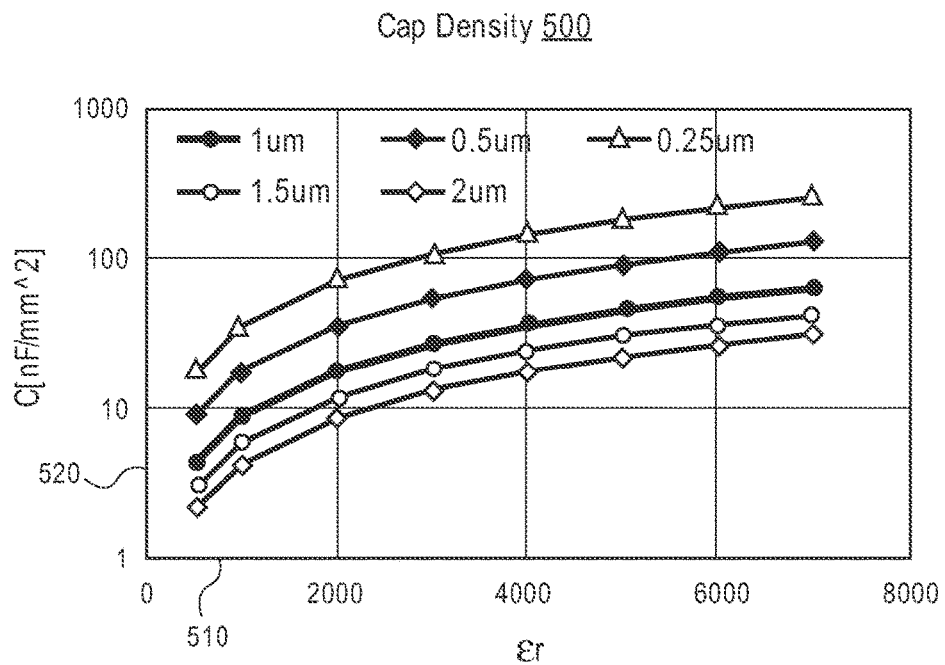
FIG. 5 illustrates a diagram for the achievable capacitance density as a function of the k-value of the dielectric and the thickness of the dielectric in accordance with one embodiment.

FIG. 5 illustrates a diagram for the achievable capacitance density in nF/mm^2 as a function of the k-value of the dielectric and the thickness of the dielectric in accordance with one embodiment. A vertical axis 520 has a capacitance density in units of nF/mm^2 and a horizontal axis 510 has a k-value of the dielectric layer for different thicknesses of the dielectric layer. Different selected values of $\varepsilon_r$ (i.e., relative permittivity at e.g., 500, 1000, 2000, etc.) are plotted on the diagram 500 to show an increase in capacitance density for higher values of $\varepsilon_r$ and lower thicknesses of the ultra-high-k dielectric layer. Relative permittivity is also commonly known as dielectric constant (k). Relative permittivity of a material is its absolute permittivity expressed as a ratio relative to the permittivity of vacuum.

The present design includes a substrate package architecture with embedded multi-layer capacitors with high capacitance density that rival current discrete capacitors with the primary application being power delivery applications. The dielectric materials used for capacitors of the present design may be similar to those used in current discrete capacitors. In fact, any ultra-high-k material solution available for printing can be used. The electrodes can include most metals compatible with the ultra-high-k dielectric material. Since these metals are mostly noble metals (e.g., Pt, Au, Ag), these metals can be printed without concerns regarding oxidation.

Figure 6A:
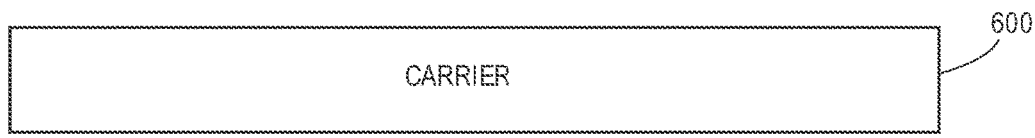
FIGS. 6A-6O illustrate a process for fabricating package-integrated ultra-high-k capacitors that are embedded within an organic substrate in accordance with one embodiment.
Figure 6B:
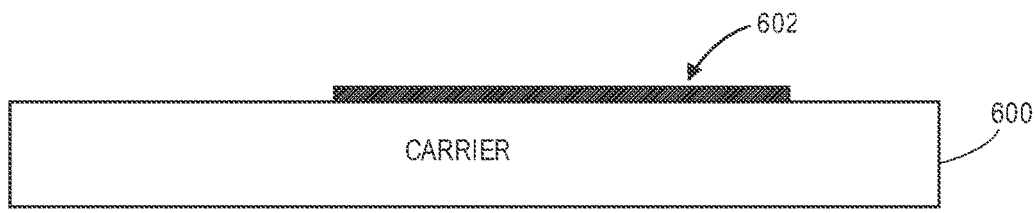
Figure 6C:
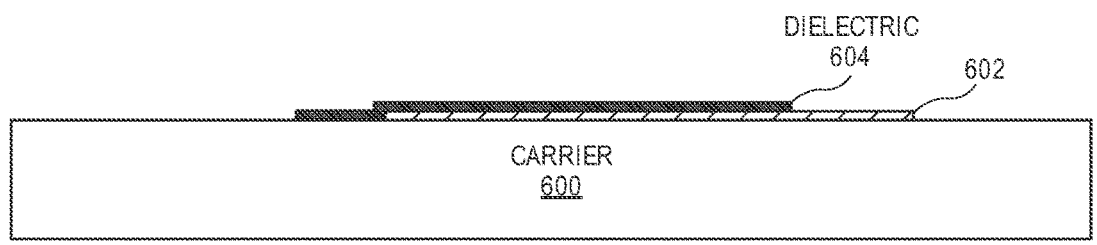
Figure 6D:
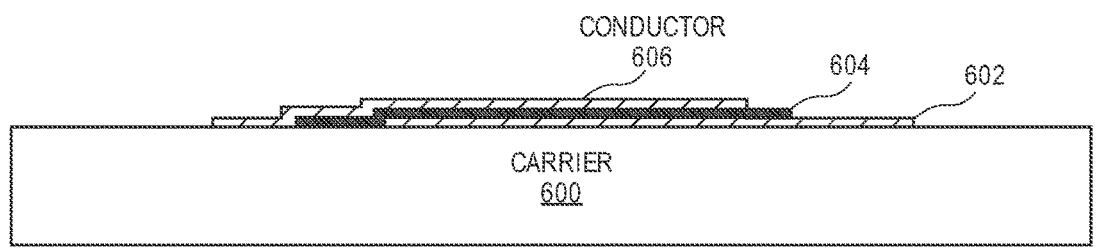
Figure 6E:
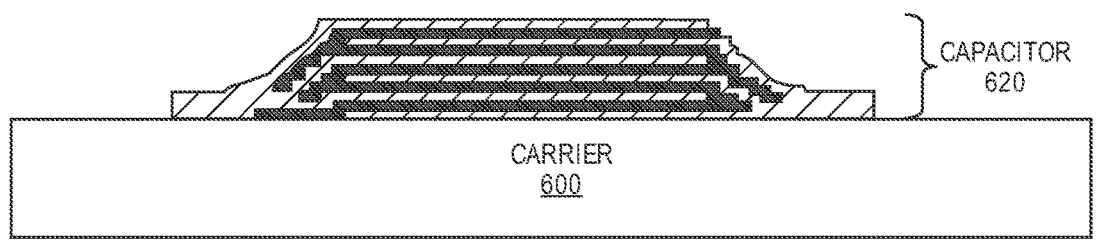
Figure 6F:
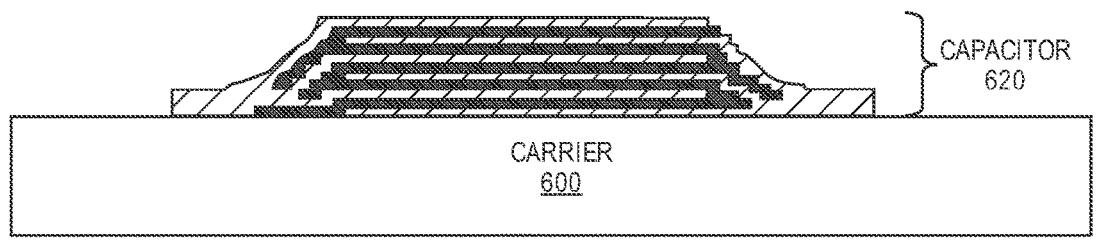
Figure 6H:
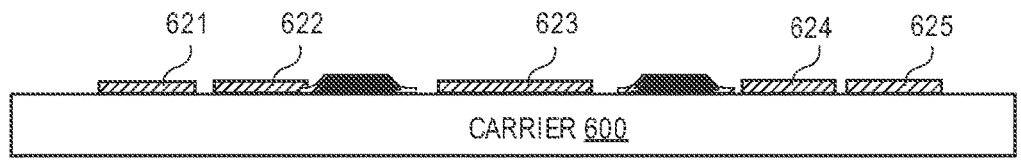
Figure 6I:
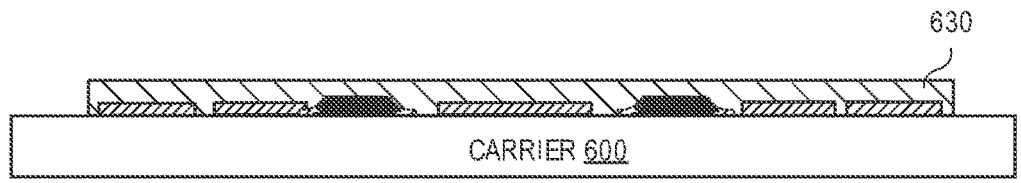
Figure 6J:
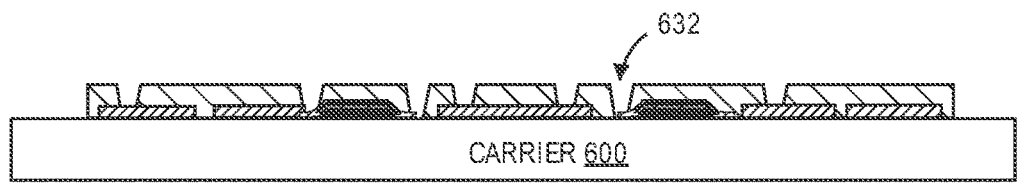
Figure 6K:
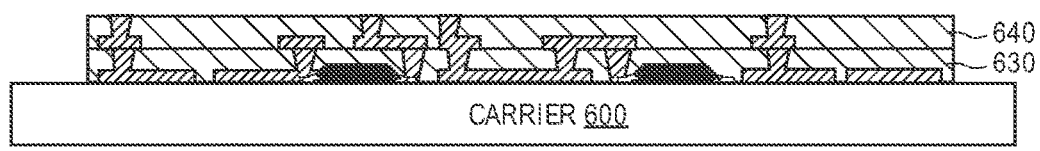
Figure 6L:
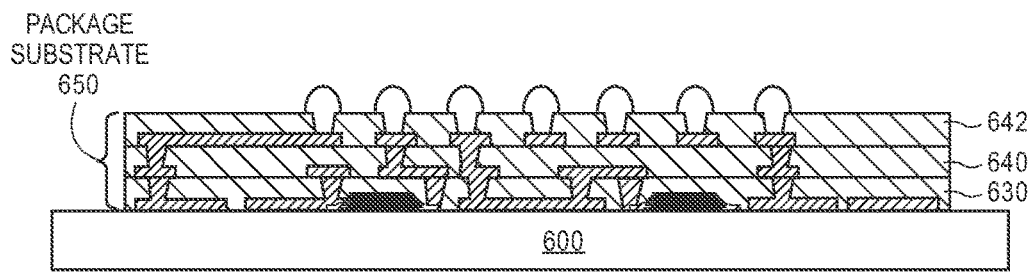
Figure 6M:
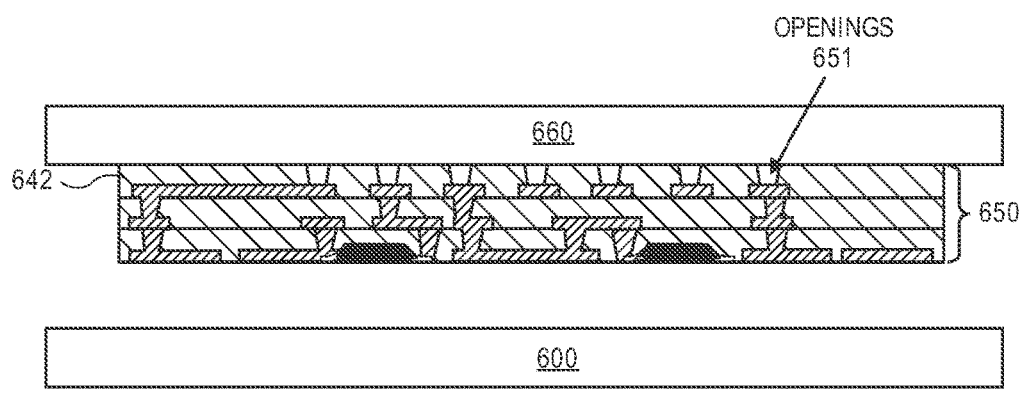
Figure 6N:
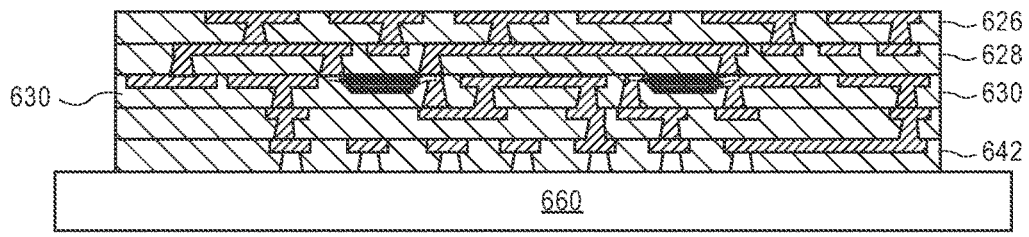
Figure 6O:
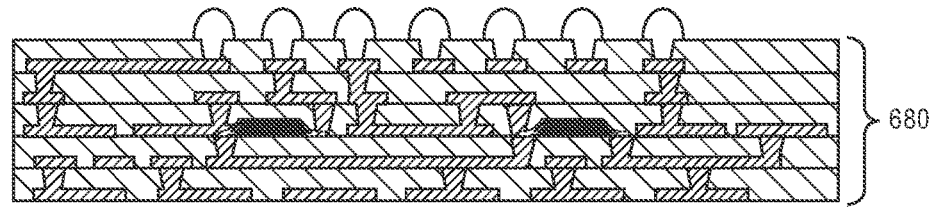

FIGS. 6A-6O illustrate a process for fabricating package-integrated ultra-high-k capacitors that are embedded within an organic substrate in accordance with one embodiment. A carrier 600 as illustrated in FIG. 6A can be a single layer or multi-layer carrier (e.g., ceramic glass) with different peel/release mechanisms possible. A carrier size can be panel-level, strip-level, or unit-level. A conductor 602 (e.g., bottom layer capacitor plate) is formed on the carrier as illustrated in FIG. 6B. In one example, a conductor paste or ink is printed on the carrier and then dried or solidified.

A dielectric layer 604 (e.g., ultra-high-k dielectric layer of capacitor) is formed on the conductor 602 as illustrated in FIG. 6C. In one example, a dielectric layer paste or ink is printed on the conductor and then dried. The printing processes used for both dielectric and electrodes can be inkjet printing, offset printing, gravure printing, stencil printing or other print methods, depending on the characteristics of the conductive and dielectric inks/pastes used as precursors.

A conductor 606 (e.g., upper capacitor plate) is formed on the dielectric layer 604 as illustrated in FIG. 6D. In one example, a conductor paste or ink is printed on the carrier and then dried or solidified. The operations of printing conductors and dielectric layer are repeated until forming a capacitor 620 having a desired number of electrodes and dielectric layers as illustrated in FIG. 6E. The layers of the capacitor are thermally annealed, sintered, and/or densified with a high temperature process (e.g., 900-1500 degrees Celsius) and capacitor processing completes as illustrated in FIG. 6F.

Then, a substrate package build process starts or continues by forming conductive layers on the carrier 600 in regions that are adjacent to the capacitors as illustrated in FIG. 6H. In one example, the conductive layers 621-625 are formed by seed layer deposition, lithography cycle (e.g., dry film photoresist (DFR) lamination, exposure, develop), conductive plate traces, remove DFR, and etch the seed layer.

FIG. 6I illustrates the carrier 600 after laminating a first buildup film layer (e.g., organic package layer 630) on the carrier, capacitors, and conductive layers. Next, openings (e.g., opening 632, vias) are formed in the package layer 630 as illustrated in FIG. 6J. In one example, laser drilling forms the openings. FIG. 6K illustrates the carrier 600 after laminating a second buildup film layer (e.g., organic package layer 640) on the first layer 630 while also forming conductive layers. FIG. 6L illustrates a package substrate 650 that is formed on the carrier 600 after laminating a third buildup film layer (e.g., organic package layer 642) on the second layer 640 while also forming conductive layers.

In one example, the carrier 600 is detached and the substrate 650 goes to die-attach/assembly. The capacitors would be on the substrate bottom as illustrated in FIG. 4. For capacitors integrated within the substrate as illustrated in FIG. 3 the flow would continue as illustrated in FIG. 6M with the solder bumping illustrated in FIG. 6L being omitted. FIG. 6M illustrates openings 651 being formed in the third layer 642 for solder bumping if required, a second carrier 660 being attached to the layer 642, and the carrier 600 being removed from the substrate 650.

FIG. 6N illustrates the carrier 660 and substrate 650 after being flipped with additional organic layers 626 and 628 being formed. FIG. 6) illustrates a package substrate 680 upon having the carrier 660 removed, flipping the substrate 680, and bumping an upper layer of the substrate 680. The substrate 680 then proceeds to assembly.

Another process could at the end of the flow in FIG. 6L omit the detach of the carrier 600 prior to assembly and have a carrier detach post assembly. Mold could be added prior to carrier detach as well. FIG. 7A illustrates attaching a die 780 to the package substrate 650. The carrier 600 is removed as illustrated in a microelectronic device 700 of FIG. 7B.

Regarding capacitor manufacturing there is another approach. The final firing/sintering operation of the entire stack can be omitted, if after the printing and drying of each dielectric layer a laser annealing operation is added to induce crystallization of this layer and provide the desired high-k and low leakage properties. Most conductive pastes work sufficiently well after drying, but a laser anneal operation can also be optionally added after the printing and drying of the electrodes to improve performance.

Figure 8A:
FIGS. 8A-8D illustrate a process for fabricating package-integrated ultra-high-k capacitors that are embedded within an organic substrate in accordance with one embodiment.
Figure 8B:
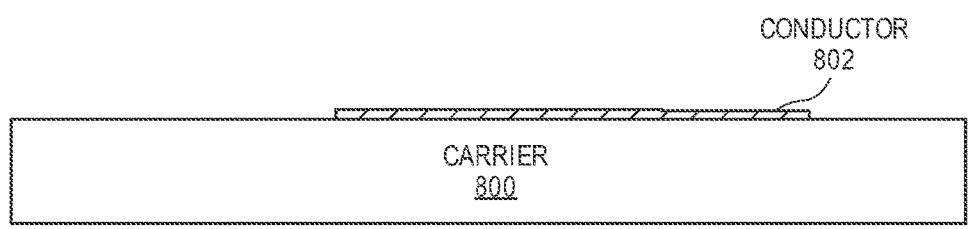

FIGS. 8A-8D illustrate a process for fabricating package-integrated ultra-high-k capacitors that are embedded within an organic substrate in accordance with one embodiment. A carrier 800 as illustrated in FIG. 8A can be a single layer or multi-layer carrier with different peel/release mechanisms possible. A carrier size can be panel-level, strip-level, or unit-level. A conductor 802 (e.g., bottom layer capacitor plate) is formed on the carrier as illustrated in FIG. 8B. In one example, a conductor paste or ink is printed on the carrier and then dried or solidified. A laser anneal can be performed if needed.

Figure 8C:
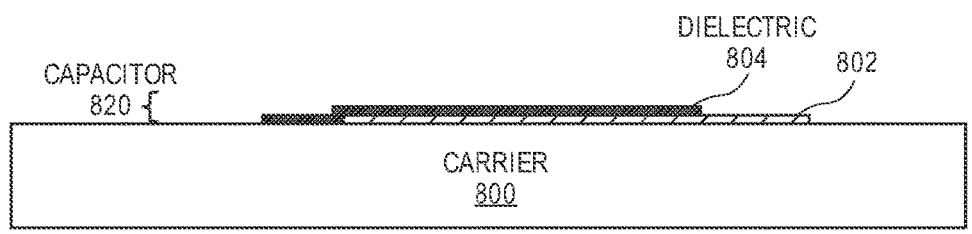

A dielectric layer 804 (e.g., ultra-high-k dielectric layer of capacitor) is formed on the conductor 802 as illustrated in FIG. 8C. In one example, a dielectric layer paste or ink is printed on the conductor and then dried. A laser anneal can be performed to obtain desired dielectric properties.

Figure 8D:
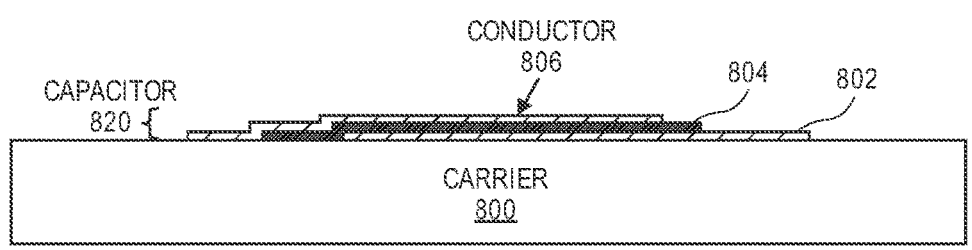

A conductor 806 (e.g., upper capacitor plate) is formed on the dielectric layer 804 as illustrated in FIG. 8D. In one example, a conductor paste or ink is printed on the carrier and then dried or solidified. A laser anneal can be performed if needed. The operations of printing conductors and dielectric layers can be repeated until forming a capacitor 820 having a desired number of electrodes and dielectric layers.

Figure 9A:
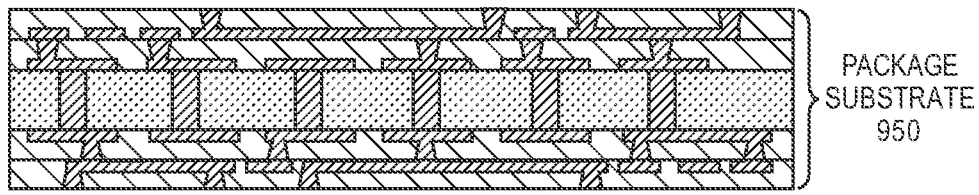
FIGS. 9A-9C illustrate package-integrated ultra-high-k capacitors that are embedded within an organic substrate in accordance with one embodiment.
Figure 9B:
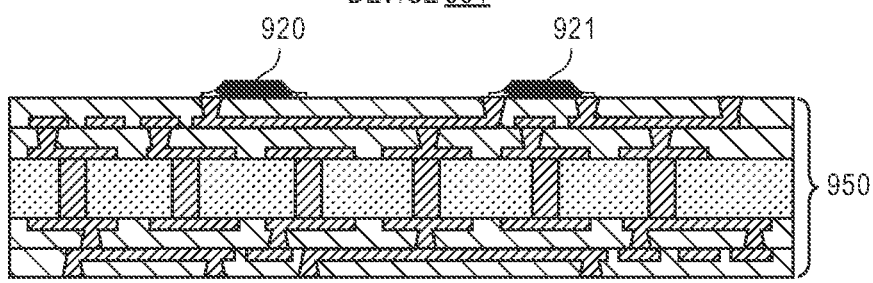
Figure 9C:
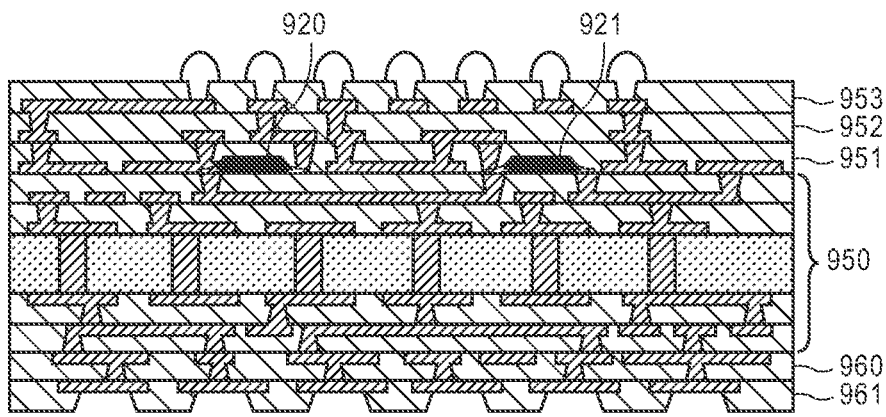

For laser annealing operations, the carrier substrate temperatures encountered during annealing may be low enough to allow for manufacturing of these capacitors integrated directly into the organic package substrate, using this substrate as a permanent carrier (e.g., 800), and resulting in various embodiments as illustrated in FIGS. 9A, 9B and 9C.

FIG. 9A illustrates a partially finished package substrate 950 in accordance with one embodiment. Capacitors 920 and 921 are formed on the package substrate 950 as illustrated in FIG. 9B in accordance with the capacitor manufacturing of FIGS. 8B-8D. FIG. 9C illustrates adding additional organic layers (e.g., 950-953, 960-961) to the package substrate.

Figure 10A:
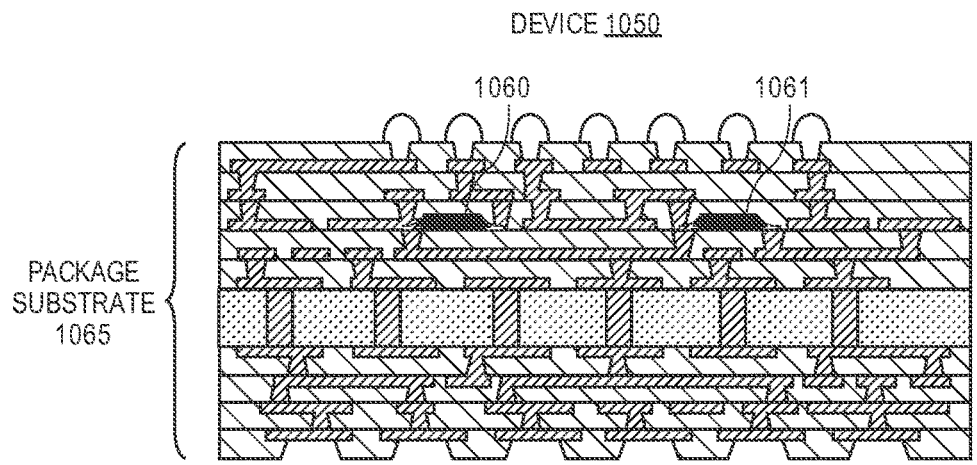
FIGS. 10A-C show additional embodiments with a slightly modified process flow that would allow for capacitor manufacturing at lower temperatures on microelectronic devices in accordance with one embodiment.
Figure 10B:
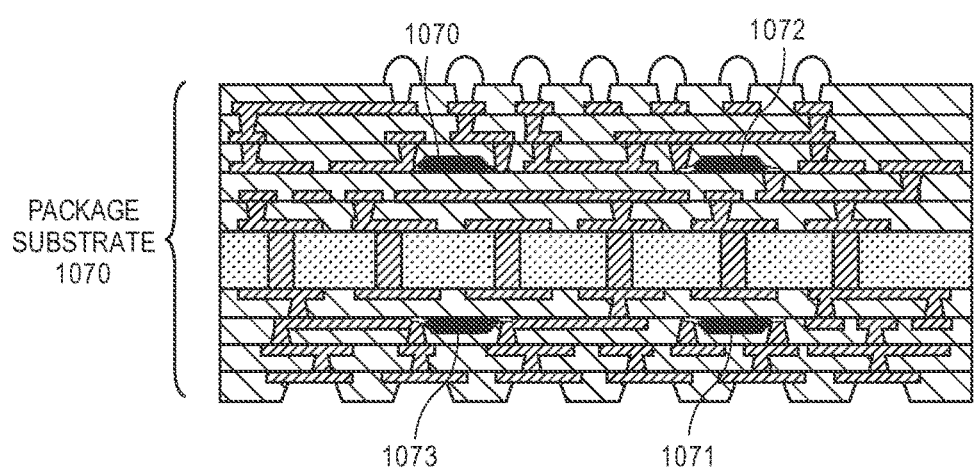
Figure 10C:
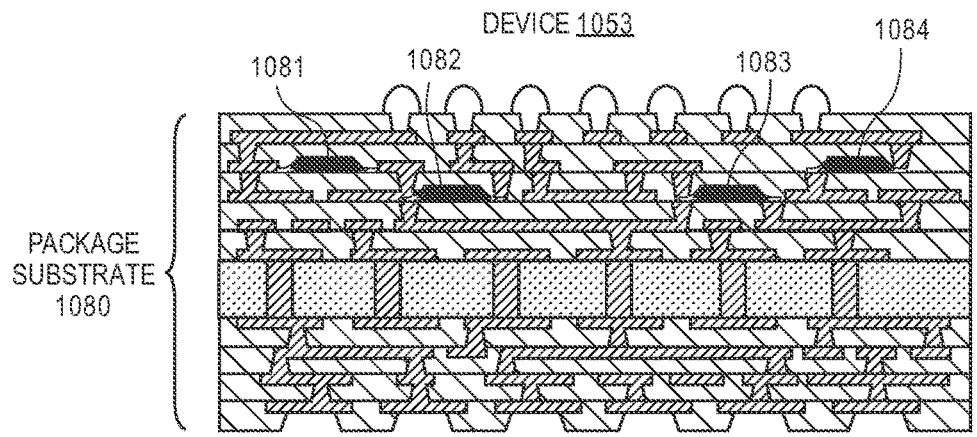

FIGS. 10A-C show additional embodiments with a slightly modified process flow that would allow for capacitor manufacturing at lower temperatures on microelectronic devices in accordance with one embodiment. With this alternative process flow as illustrated in FIGS. 10A-C, embodiments are possible with capacitors in several layers of the package substrate on cored and coreless packages.

FIG. 10A illustrates a microelectronic device 1050 that includes package substrate 1065 (e.g., package substrate with core) having integrated capacitors 1060 and 1061. FIG. 10B illustrates a microelectronic device 1052 that includes package substrate 1070 having integrated capacitors 1070-1073. FIG. 10C illustrates a microelectronic device 1053 that includes package substrate 1080 having integrated capacitors 1081-1084.

The present design reduces the overall form-factor of products, both areal (x, y) and thickness (Z), thus providing a form-factor advantage, resulting in lower cost of manufacturing.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a crystalline substrate formed using a bulk silicon or a silicon-on-insulator substructure. In other implementations, the microelectronic device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of the present invention.

The microelectronic device may be one of a plurality of microelectronic devices formed on a larger substrate, such as, for example, a wafer. In an embodiment, the microelectronic device may be a wafer level chip scale package (WLCSP). In certain embodiments, the microelectronic device may be singulated from the wafer subsequent to packaging operations, such as, for example, the formation of one or more piezoelectric vibrating devices.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 11:
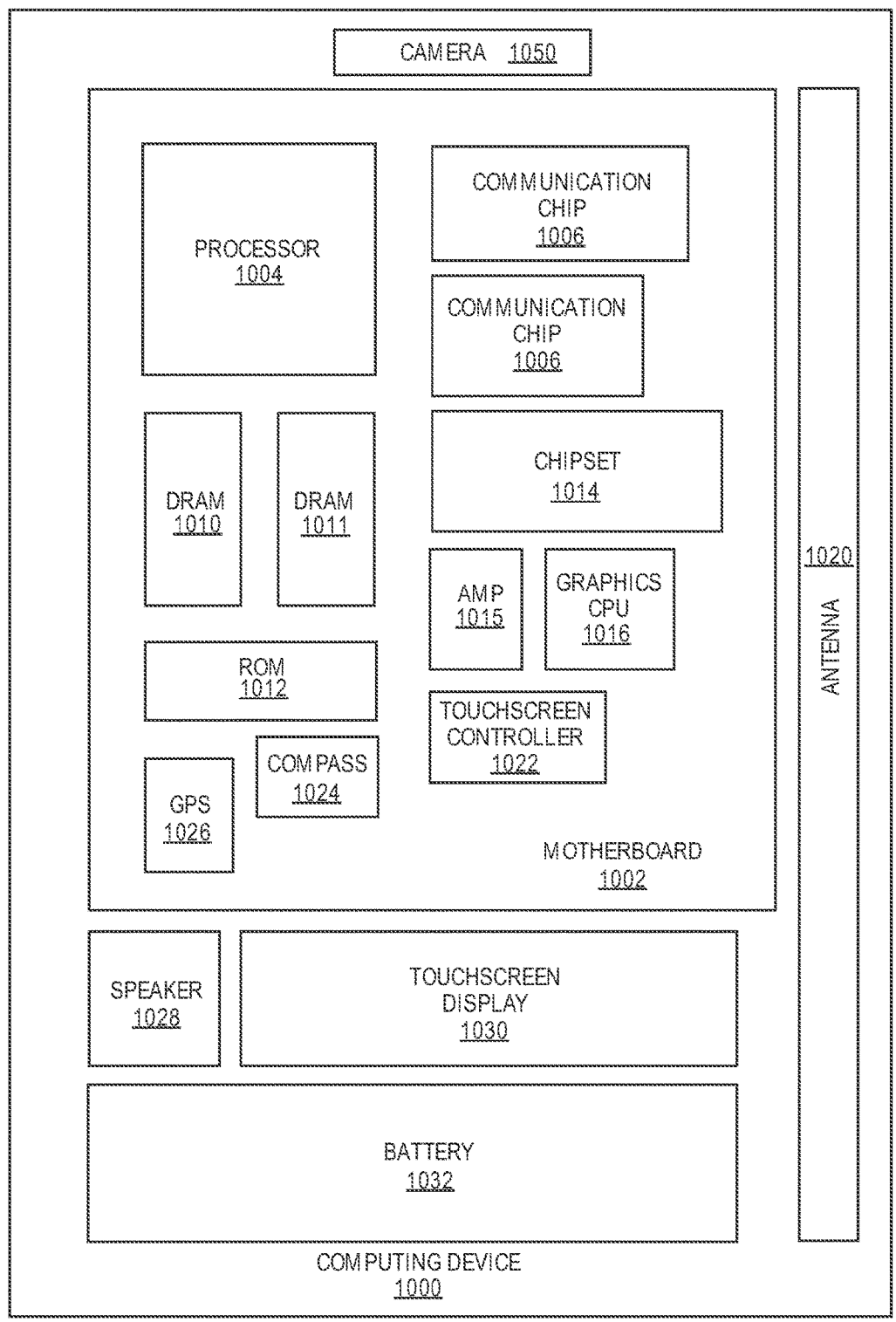
FIG. 11 illustrates a computing device 1000 in accordance with one embodiment.

FIG. 11 illustrates a computing device 1000 in accordance with one embodiment. The computing device 1000 houses a board 1002. The board (e.g., motherboard, printed circuit board, etc.) may include a number of components, including but not limited to at least one processor 1004 and at least one communication chip 1006. The at least one processor 1004 is physically and electrically coupled to the board 1002. In some implementations, the at least one communication chip 1006 is also physically and electrically coupled to the board 1002. In further implementations, the communication chip 1006 (e.g., microelectronic device 100, 300, 400, 700, 900-902, 1050, 1052, 1053, etc.) is part of the processor 1004.

Depending on its applications, computing device 1000 may include other components that may or may not be physically and electrically coupled to the board 1002. These other components include, but are not limited to, volatile memory (e.g., DRAM 1010, 1011), non-volatile memory (e.g., ROM 1012), flash memory, a graphics processor 1016, a digital signal processor, a crypto processor, a chipset 1014, an antenna unit 1020, a display, a touchscreen display 1030, a touchscreen controller 1022, a battery 1032, an audio codec, a video codec, a power amplifier 1015, a global positioning system (GPS) device 1026, a compass 1024, a gyroscope, a speaker, a camera 1050, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi, WiGig, and Bluetooth and a second communication chip 1006 may be dedicated to longer range wireless communications such as GPS, EDGE, GPRS, CDMA, WiMAX, LTE, Ev-DO, 5G, and others.

The at least one processor 1004 of the computing device 1000 includes an integrated circuit die packaged within the at least one processor 1004. In some embodiments of the invention, the processor package includes one or more devices, such as microelectronic devices (e.g., microelectronic device 100, 300, 400, 700, 900-902, 1050, 1052, 1053, etc.) having a package integrated ultra-high-k capacitor in accordance with implementations of embodiments of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the invention, the communication chip package includes one or more microelectronic devices (e.g., microelectronic device 100, 300, 400, 700, 900-902, 1050, 1052, 1053, etc.) having package-integrated ultra-high-k capacitors.

The following examples pertain to further embodiments. Example 1 is a microelectronic device comprising a plurality of organic dielectric layers and a capacitor that is integrated with a first organic dielectric layer of the plurality of organic dielectric layers. The capacitor includes first and second conductive electrodes and an ultra-high-k dielectric layer that is positioned between the first and second conductive electrodes.

In example 2, the subject matter of example 1 can optionally include the capacitor having a capacitance density of at least 10 nanoFarad per millimeter$^2$.

In example 3, the subject matter of any of examples 1-2 can optionally include the ultra-high-k dielectric layer having a relative permittivity of at least 100 up to 10,000.

In example 4, the subject matter of any of examples 1-3 can optionally include first and second connections formed in the first organic dielectric layer. The first connection contacts the first conductive electrode and the second connection contacts the second electrode.

In example 5, the subject matter of any of examples 1-4 can optionally include first and second connections that are formed in a second organic dielectric layer of the plurality of organic dielectric layers. The first connection contacts the first conductive electrode and the second connection contacts the second electrode.

In example 6, the subject matter of any of examples 1-5 can optionally include a first connection that is formed in the first organic dielectric layer and a second connection that is formed in a second organic dielectric layer of the plurality of organic dielectric layers. The first connection contacts the first conductive electrode and the second connection contacts the second electrode.

In example 7, the subject matter of any of examples 1-6 can optionally include the first organic dielectric layer is an internal organic dielectric layer of the plurality of organic dielectric layers of a package substrate.

In example 8, the subject matter of any of examples 1-7 can optionally include the first organic dielectric layer that is a bottom organic dielectric layer of the plurality of organic dielectric layers of a package substrate.

In example 9, the subject matter of any of examples 1-8 can optionally include the capacitor that is integrated with the first organic dielectric layer in a coreless package substrate and the first organic dielectric layer has a thickness less than 50 microns.

In example 10, the subject matter of any of examples 1-9 can optionally include the capacitor that is formed with a parallel plate configuration.

Example 11 is a microelectronic device comprising a plurality of organic dielectric layers and a capacitor that is integrated with a first organic dielectric layer of the plurality of organic dielectric layers. The capacitor includes a plurality of conductive electrodes and at least one ultra-high-k dielectric layer with each ultra-high-k dielectric layer being positioned between two of the plurality of conductive electrodes.

In example 12, the subject matter of example 11 can optionally include first and second connections that are formed in the first organic dielectric layer. The first connection contacts an upper conductive electrode and the second connection contacts a lower conductive electrode of the capacitor.

In example 13, the subject matter of any of examples 11-12 can optionally include first and second connections that are formed in a second organic dielectric layer of the plurality of organic dielectric layers. The first connection contacts an upper conductive electrode and the second connection contacts a lower conductive electrode of the ultra-high-k capacitor.

In example 14, the subject matter of any of examples 11-13 can optionally include a first connection that is formed in the first organic dielectric layer and a second connection that is formed in a second organic dielectric layer of the plurality of organic dielectric layers. The first connection contacts an upper conductive electrode and the second connection contacts a lower conductive electrode.

Example 15 is a method to fabricate a capacitor comprising printing a first capacitor electrode layer on a carrier, printing an ultra-high-k dielectric layer on the first capacitor electrode layer, printing a second capacitor electrode layer on the ultra-high-k dielectric layer to form a capacitor, forming a conductive layer on the carrier in regions that are adjacent to the capacitor, and forming an organic dielectric layer on the capacitor and the conductive layer.

In example 16, the subject matter of example 15 can optionally include forming additional organic dielectric layers and conductive layers on a first side of the organic dielectric layer to form a partial organic package substrate and removing the carrier from the organic package substrate.

In example 17, the subject matter of any of examples 15-16 can optionally include forming additional organic dielectric layers and conductive layers on a second side of the organic dielectric layer to form an organic package substrate.

In example 18, the subject matter of any of examples 15-17 can optionally include thermal annealing the first capacitor electrode layer, the ultra-high-k dielectric layer, and the second capacitor electrode layer of the capacitor.

Example 19 is a method to fabricate a capacitor comprising forming a first capacitor electrode layer on a partial organic package substrate having organic layers, forming an ultra-high-k dielectric layer on the first capacitor electrode layer, and laser annealing the ultra-high-k dielectric layer to obtain desired dielectric properties.

In example 20, the subject matter of example 19 can optionally include forming a second capacitor electrode layer on the ultra-high-k dielectric layer to form a capacitor on the partial organic package substrate, forming a conductive layer on the partial organic package substrate in regions that are adjacent to the capacitor, and forming an organic dielectric layer on the capacitor and the conductive layer.

In example 21, the subject matter of any of examples 19-21 can optionally include additional organic dielectric layers and conductive layers on the organic dielectric layer to form an organic package substrate.

The invention claimed is:

1. A microelectronic device comprising:
a plurality of organic dielectric layers; and
a capacitor that is integrated with a first organic dielectric layer of the plurality of organic dielectric layers, and the capacitor includes first and second conductive electrodes and a plurality of vertically arranged ultra-high-k dielectric layers.

2. The microelectronic device of claim 1, wherein the capacitor has a capacitance density of at least 10 nanoFarad per millimeter$^2$.

3. The microelectronic device of claim 1, wherein each of the plurality of ultra-high-k dielectric layers has a relative permittivity of at least 100 up to 10,000.

4. The microelectronic device of claim 1, further comprising:
first and second connections formed in the first organic dielectric layer, the first connection contacts the first conductive electrode and the second connection contacts the second electrode.

5. The microelectronic device of claim 1, further comprising:
first and second connections formed in a second organic dielectric layer of the plurality of organic dielectric layers, the first connection contacts the first conductive electrode and the second connection contacts the second electrode.

6. The microelectronic device of claim 5, further comprising:
a first connection formed in the first organic dielectric layer and a second connection formed in a second organic dielectric layer of the plurality of organic dielectric layers, the first connection contacts the first conductive electrode and the second connection contacts the second electrode.

7. The microelectronic device of claim 1, wherein the first organic dielectric layer is an internal organic dielectric layer of the plurality of organic dielectric layers of a package substrate.

8. The microelectronic device of claim 1, wherein the first organic dielectric layer is a bottom organic dielectric layer of the plurality of organic dielectric layers of a package substrate.

9. The microelectronic device of claim 1, wherein the capacitor is integrated with the first organic dielectric layer in a careless package substrate and the first organic dielectric layer has a thickness less than 50 microns.

10. The microelectronic device of claim 1, wherein the capacitor is formed with a parallel plate configuration.

11. A microelectronic device comprising:
a plurality of organic dielectric layers; and
a capacitor that is integrated with a first organic dielectric layer of the plurality of organic dielectric layers, and the capacitor includes a plurality of conductive electrodes and a plurality of ultra-high-k dielectric layers with each ultra-high-k dielectric layer being positioned between two of the plurality of conductive electrodes.

12. The microelectronic device of claim 11, further comprising:
first and second connections formed in the first organic dielectric layer, the first connection contacts an upper conductive electrode and the second connection contacts a lower conductive electrode of the capacitor.

13. The microelectronic device of claim 11, further comprising:
first and second connections formed in a second organic dielectric layer of the plurality of organic dielectric layers, the first connection contacts an upper conductive electrode and the second connection contacts a lower conductive electrode of the ultra-high-k capacitor.

14. The microelectronic device of claim 11, further comprising:
a first connection formed in the first organic dielectric layer and a second connection formed in a second organic dielectric layer of the plurality of organic dielectric layers, the first connection contacts an upper conductive electrode and the second connection contacts a lower conductive electrode.

15. A method to fabricate a capacitor comprising:
printing a first capacitor electrode layer on a carrier;
printing a first ultra-high-k dielectric layer on the first capacitor electrode layer;
printing a second capacitor electrode layer on the first ultra-high-k dielectric layer to form a capacitor;
printing a second ultra-high-k dielectric layer on the second capacitor electrode layer;
printing a third capacitor electrode layer on the second ultra-high-k dielectric layer and on the first capacitor electrode layer;
forming a conductive layer on the carrier in regions that are adjacent to the capacitor; and
forming an organic dielectric layer on the capacitor and the conductive layer.

16. The method of claim 15, further comprising:
forming additional organic dielectric layers and conductive layers on a first side of the organic dielectric layer to form a partial organic package substrate; and
removing the carrier from the organic package substrate.

17. The method of claim 16, further comprising:
forming additional organic dielectric layers and conductive layers on a second side of the organic dielectric layer to form an organic package substrate.

18. The method of claim 15, further comprising:
thermal annealing the first capacitor electrode layer, the first and second ultra-high-k dielectric layers, and the second capacitor electrode layer of the capacitor.

19. A method to fabricate a capacitor comprising:
forming a first capacitor electrode layer on a partial organic package substrate having organic layers;
forming a first ultra-high-k dielectric layer on the first capacitor electrode layer;
laser annealing the first ultra-high-k dielectric layer to obtain desired dielectric properties;
forming a second capacitor electrode layer on the first ultra-high-k dielectric layer;
forming a second ultra-high-k dielectric layer on the second capacitor electrode layer; and
forming a third capacitor electrode layer on the second ultra-high-k dielectric layer and on the first capacitor electrode layer.

20. The method of claim 19, further comprising:
forming a conductive layer on the partial organic package substrate in regions that are adjacent to the capacitor; and
forming an organic dielectric layer on the capacitor and the conductive layer.

21. The method of claim 20, further comprising:
forming additional organic dielectric layers and conductive layers on the organic dielectric layer to form an organic package substrate.

* * * * *